(12) United States Patent
Jin et al.

(10) Patent No.: US 7,737,412 B2
(45) Date of Patent: Jun. 15, 2010

(54) ELECTRON MICROSCOPE PHASE ENHANCEMENT

(75) Inventors: Jian Jin, Berkeley, CA (US); Robert M. Glaeser, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 305 days.

(21) Appl. No.: 11/571,980

(22) PCT Filed: Jul. 12, 2005

(86) PCT No.: PCT/US2005/024601

§ 371 (c)(1),
(2), (4) Date: Sep. 21, 2007

(87) PCT Pub. No.: WO2006/017252

PCT Pub. Date: Feb. 16, 2006

(65) Prior Publication Data

US 2008/0035854 A1    Feb. 14, 2008

Related U.S. Application Data

(60) Provisional application No. 60/587,517, filed on Jul. 12, 2004, provisional application No. 60/806,961, filed on Jul. 11, 2006.

(51) Int. Cl.
*G21K 5/04* (2006.01)
*H01J 37/24* (2006.01)
(52) U.S. Cl. .............. 250/396 R; 250/309; 250/311
(58) Field of Classification Search ............ 250/396 R, 250/311, 307, 397, 396 ML, 306, 309, 310, 250/492.1, 492.3
See application file for complete search history.

(56) References Cited

U.S. PATENT DOCUMENTS

| | | | | |
|---|---|---|---|---|
| 5,814,815 | A | * | 9/1998 | Matsumoto et al. .......... 250/311 |
| 2002/0130276 | A1 | * | 9/2002 | Sogard ..................... 250/492.2 |
| 2003/0066964 | A1 | * | 4/2003 | Nagayama et al. .......... 250/311 |
| 2003/0132383 | A1 | * | 7/2003 | Benner ....................... 250/311 |

FOREIGN PATENT DOCUMENTS

EP    0 782 170 A3    7/1997

* cited by examiner

*Primary Examiner*—Jack I Berman
*Assistant Examiner*—Nicole Ippolito Rausch
(74) *Attorney, Agent, or Firm*—Fulbright & Jaworski LLP

(57) ABSTRACT

A microfabricated electron phase shift element is used for modifying the phase characteristics of an electron beam passing though its center aperture, while not affecting the more divergent portion of an incident beam to selectively provide a ninety-degree phase shift to the unscattered beam in the back focal plan of the objective lens, in order to realize Zernike-type, in-focus phase contrast in an electron microscope. One application of the element is to increase the contrast of an electron microscope for viewing weakly scattering samples while in focus. Typical weakly scattering samples include biological samples such as macromolecules, or perhaps cells. Preliminary experimental images demonstrate that these devices do apply a ninety degree phase shift as expected. Electrostatic calculations have been used to determine that fringing fields in the region of the scattered electron beams will cause a negligible phase shift as long as the ratio of electrode length to the transverse feature-size aperture is about 5:1. Calculations are underway to determine the feasibility of aspect smaller aspect ratios of about 3:1 and about 2:1.

20 Claims, 12 Drawing Sheets laser heating

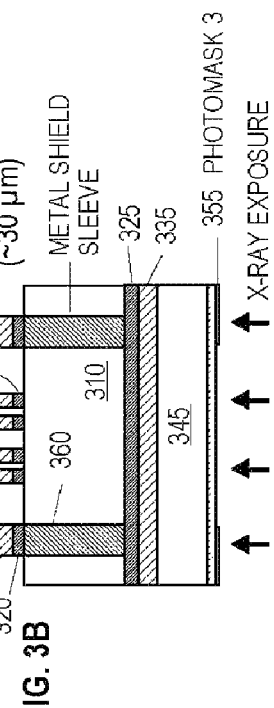
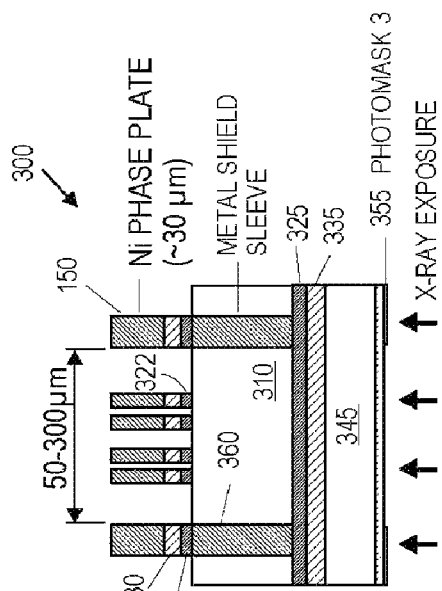
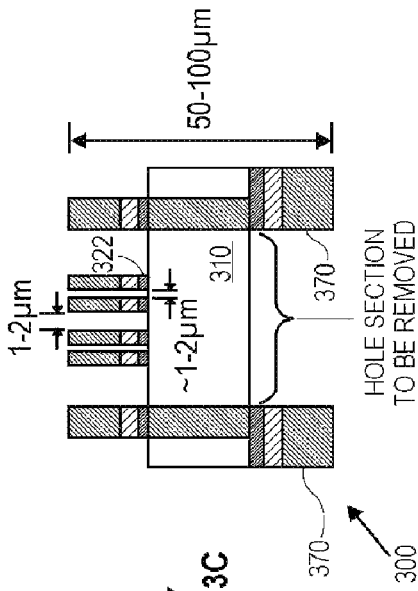
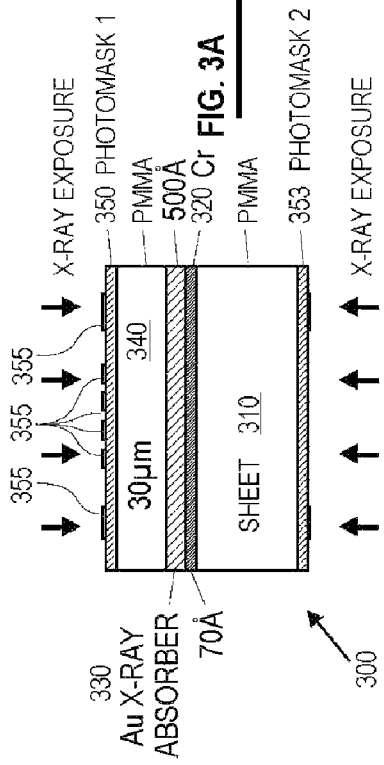
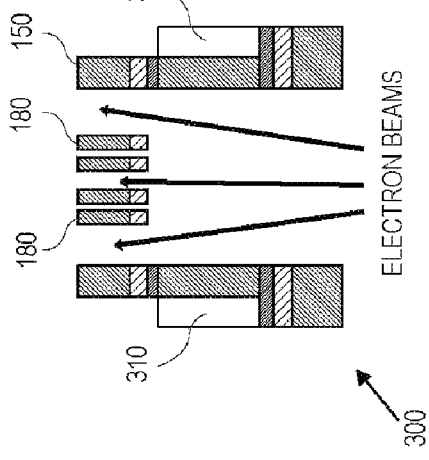
FIG. 3A  FIG. 3B  FIG. 3C  FIG. 3D

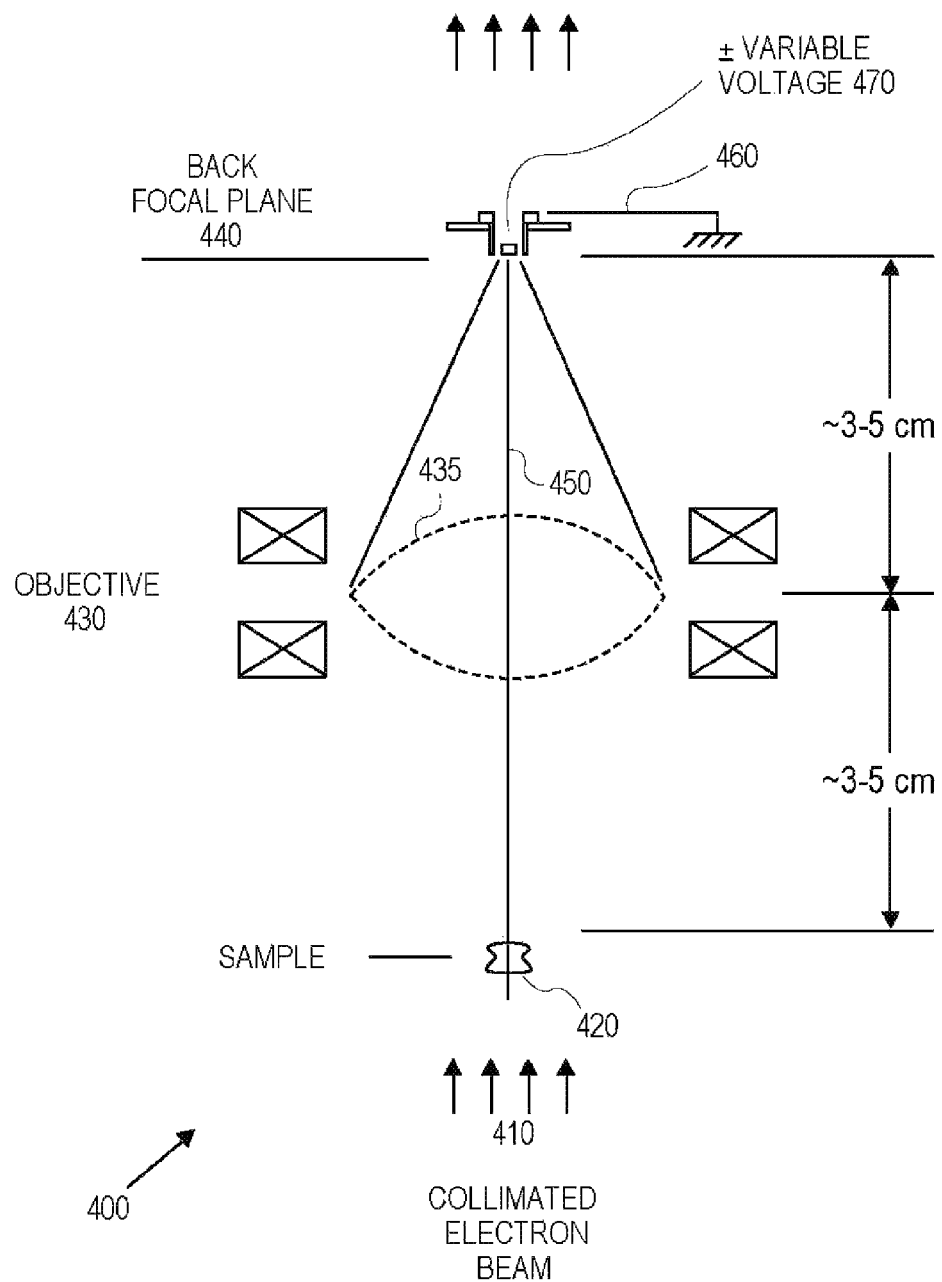

Backside mask    Oxide RIE

DRIE + Oxide Release + Cleaning

US 7,737,412 B2

ELECTRON MICROSCOPE PHASE ENHANCEMENT

CROSS REFERENCE TO RELATED APPLICATIONS

This application claims benefit of priority of Patent Cooperation Treaty patent application PCT/US2005/024601 filed Jul. 12, 2005, which in turn claims benefit of priority to U.S. provisional patent application No. 60/587,517 filed Jul. 12, 2004, both of which are hereby incorporated by reference in their entireties, and U.S. provisional patent application No. 60/806,961 filed Jul. 11, 2006, which is also hereby incorporated by reference in its entirety

STATEMENT REGARDING FEDERAL FUNDING

This invention was made with U.S. Government support under Contract Number DE-AC02-05CH11231 between the U.S. Department of Energy and The Regents of the University of California for the management and operation of the Lawrence Berkeley National Laboratory. The U.S. Government has certain rights in this invention.

REFERENCE TO A COMPUTER PROGRAM

Not Applicable.

BACKGROUND OF THE INVENTION

1. Field of the Invention

The present invention generally relates to electrostatic electron beam phase control, more specifically to microfabricated (also known as micromachined) electrostatic electron beam phase control, and still more specifically to micromachined electrostatic electron beam phase control in an electron microscope for contrast enhancement.

2. Description of the Relevant Art

A standard way that people currently address the problem of producing usable amounts of image contrast for weak phase objects is to operate an electron microscope in a substantially out-of-focus condition. This practice only produces a significant amount of contrast over a limited range of spatial frequency, also known as resolution. At resolutions both below and above a selected range, however, the contrast either remains weak or oscillates undesirably from positive to negative contrast.

A less standard approach for contrast enhancement, which is apparently not yet used in practice, is to shift the phase of the scattered electrons relative to the unscattered beam by placing a thin film of uniform thickness (of an appropriate material, such as carbon) at the back focal plane, with a small hole in the center for the unscattered beam. This approach is partially effective, but comes at the cost of losing about ⅓ of the scattered electrons, because these are scattered a second time by the thin film.

The publication "Uber die Kontraste von Atomen im Elektronenmikroskop" by Hans Boersch, Jun. 18, 1947, which is hereby incorporated by reference in its entirety, relates to electron microscope contrast.

The publication "LIGA Micromachining and Microdevices Using Deep Etch X-ray Lithography at Beamline 3.3.2" by Boehme and Wiberk, undated, which is hereby incorporated by reference in its entirety, relates to LIGA micromanufacturing.

The publication "Intro to electron optics" located at http://www.bio.umass.edu/microscopy/technai/tem/eointro.htm, which is hereby incorporated by reference in its entirety, relates to electron optical systems.

The publication "Particle-Particle Interaction Effects in Image Projection Lithography Systems" by S. D. Berger, D. J. Eaglesham, R. C. Farrow, R. R. Freemean, J. S. Kraus, and J. A. Liddle of AT&T Bell Laboratories, Murray Hill, N.J., which is hereby incorporated by reference in its entirety, relates to electron Coulomb interactions.

The publication "Aberration Correction In Electron Microscopy" by the Material Science Division of Argonne National Laboratory, Jul. 18-20, 2000, which is hereby incorporated by reference in its entirety, relates to improvement in aberrations in electron microscopes.

The publication "Electron interference: mystery and reality" by Hannes Lichte, Dresden University, Mar. 28, 2002, which is hereby incorporated by reference in its entirety, relates to electron interference effects.

BRIEF SUMMARY OF THE INVENTION

This invention provides an apparatus for electrostatic control of a charged particle beam, comprising: a) a means for electrostatically controlling a charged particle beam; b) a means for guarding said electrostatic control means, said guard means disposed about said electrostatic control means; and c) a voltage source electrically disposed between, and in charged connection with, said electrostatic control means and said guard means.

In an alternate embodiment, this invention provides an apparatus for electrostatic control of a charged particle beam, comprising: a) a charged aperture structure comprising: i) a central tube 110 with an aperture 190; ii) a conductive plate 120 extending from said central tube 110; iii) a bias support 130 extending from said conductive plate 120; and b) a guard ring structure disposed about and electrically isolated from said charged aperture structure, said guard ring structure comprising: i) a guard ring base 150; ii) a bulk opening perimeter 160 formed in said guard ring base 150 substantially surrounding said aperture 190, said bulk opening perimeter 160 forming a partially open space 165; iii) two grounded projections 170 extending from said guard ring base 150 on both sides of said conductive plate 120 into said partially open space 165; iv) a grounded tube 180 connecting both sides of said grounded projections 170, spaced apart from and radially enveloping said central tube 110. In alternate embodiments, the grounded tube 180 radially envelops said central tube 110 either with the same length along the optical axis, or with the grounded tube 180 extending on either or both ends further than the central tube 110.

In another embodiment, this invention provides a method of electron microscope phase enhancement, comprising: a) providing an electron microscope; b) providing the apparatus for electrostatic control of a charged particle beam of claims 1-8; and c) positioning said apparatus at a back focal plane of said microscope, in axial alignment with an electron optical axis of said microscope.

In another embodiment, this invention provides a method of manufacturing an electron microscope phase enhancement element comprising: a) a means for forming a spatially connected phase enhancement tube, a guard ring tube, and a metal sleeve; b) a means for extending said metal sleeve into a metal shield; c) a means for forming a thick metal structure support upon said metal shield; and d) mounting said spatially connected phase enhancement tube, guard ring thick metal structure support upon a base.

BRIEF DESCRIPTION OF THE SEVERAL VIEWS OF THE DRAWINGS

The invention will be more fully understood by reference to the following drawings, which are for illustrative purposes only.

$R_{out}$ is the outer radius of the objective lens aperture;

$R_{in}$ is the radius of the central hole of the biased electrode;

$L_{b1}$ is the length of the silicon beam that comprises the biased electrode;

$w_1$ and $w_2$ are the widths of the walls of the nearly cylindrical "biased electrode" and "grounded, guard electrode", respectively, as well as their supporting beams; and $g_1$ is the width of the gap between the biased electrode and the guard electrode.

Figure 1A:
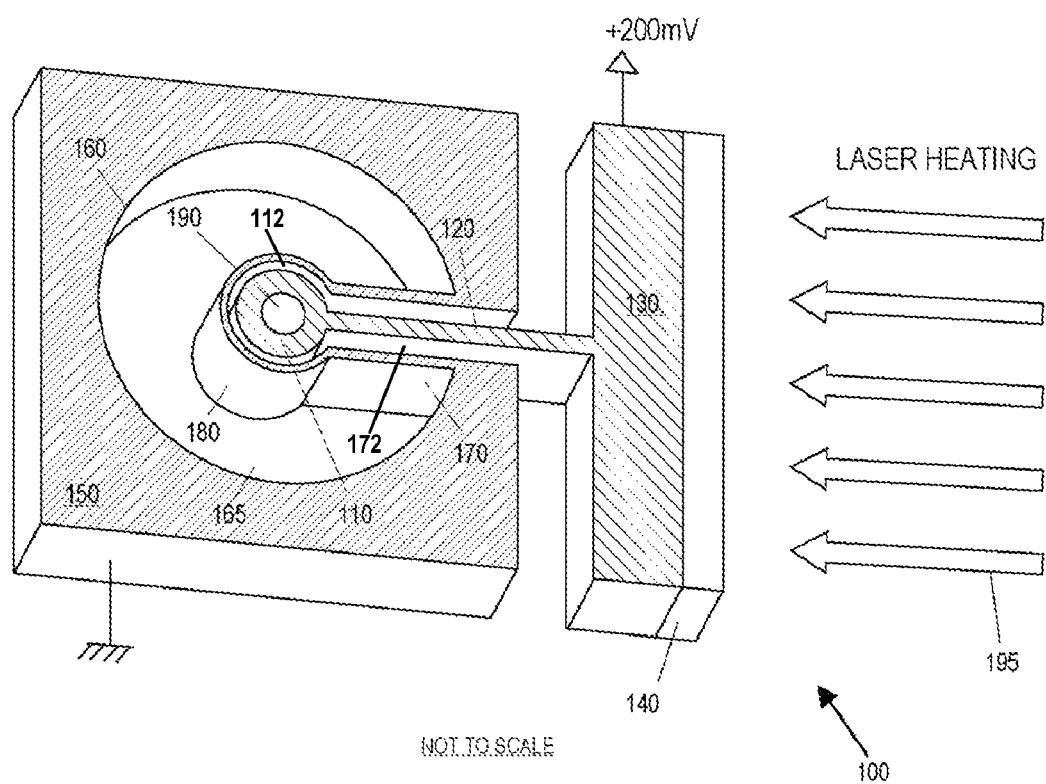
FIG. 1A is perspective rendering of an electron phase shifting, contrast enhancement element.
Figure 1B:
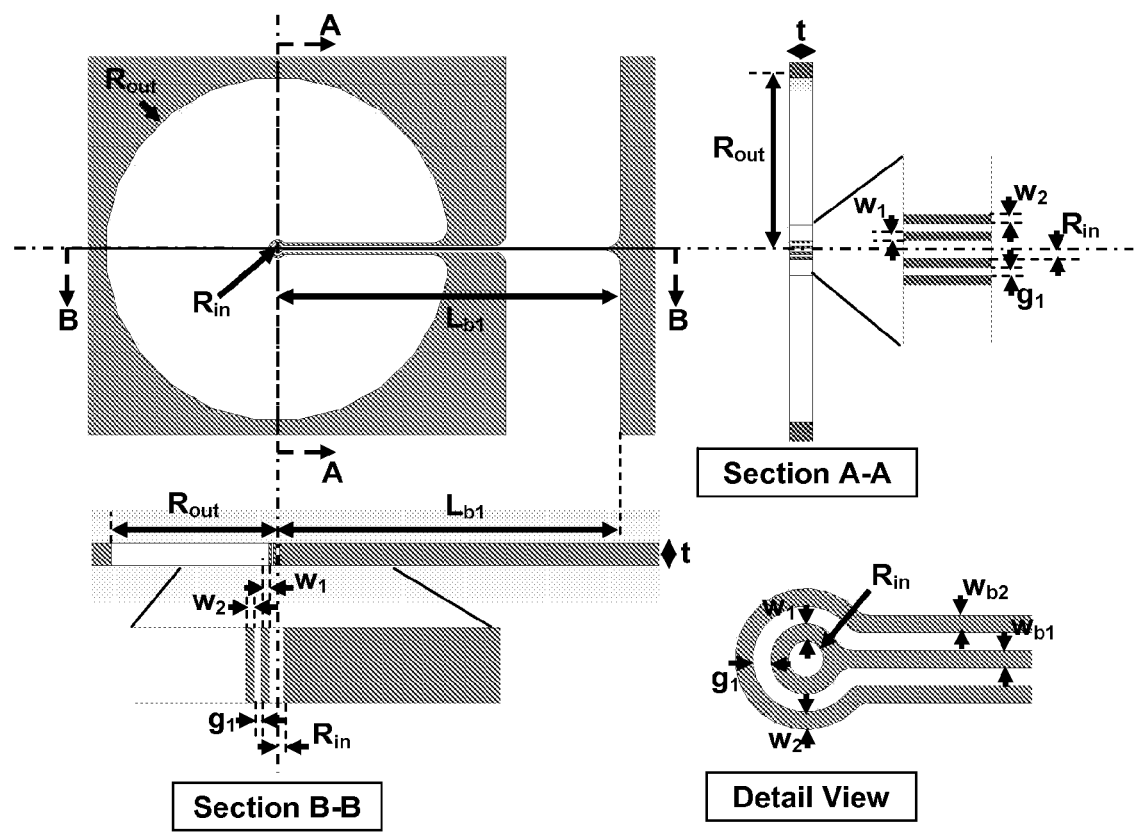
FIG. 1B is a schematic drawing that illustrates the concept of a two-electrode phase contrast device. Key features and dimensions are labeled with equation variables in the figure.
Figure 1C:
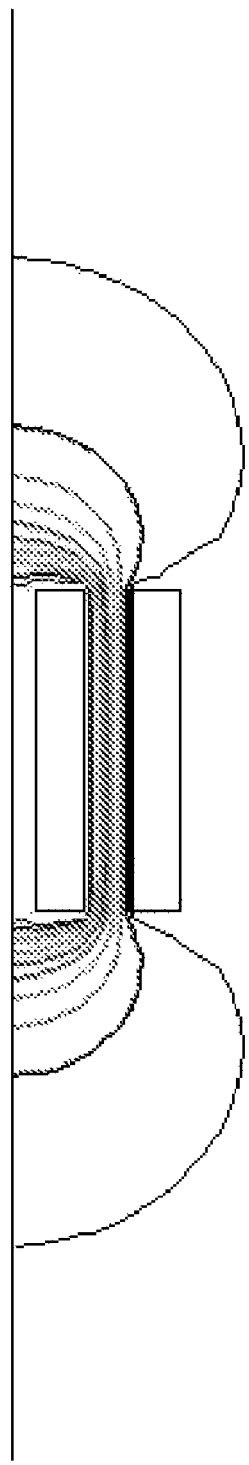

FIG. 1C is an example of electrostatic calculations performed for a representative example of the structural parameters of the phase contrast device (device thickness=10 µm; $R_{out}$=150 µm; $R_{in}$=0.75 µm; $W_1$, $W_2$, $W_{b1}$, $W_{b2}$, and $g_1$ all=1.5 µm; and $L_{b1}$=224.9 µm. These and other calculations extended to a distance of 500 µm above and below the device in order to avoid artifacts from placing a grounded boundary that is unrealistically close to the device; test calculations indicated negligible changes when the grounded boundary was located 1 mm from the electrodes. The plane shown here is a longitudinal section through the phase-contrast element, corresponding to Section B-B in FIG. 1B, and the central axis of the biased electrode coincides with the left hand margin in this figure. The walls of the biased electrode and the grounded electrode are shown as white bars. Since the calculation approximates the electrodes as perfect cylinders, only half of the longitudinal section is shown, and the full three-dimensional potential is effectively a figure of revolution about the indicated central axis on the left hand side of the figure.

Figure 2:
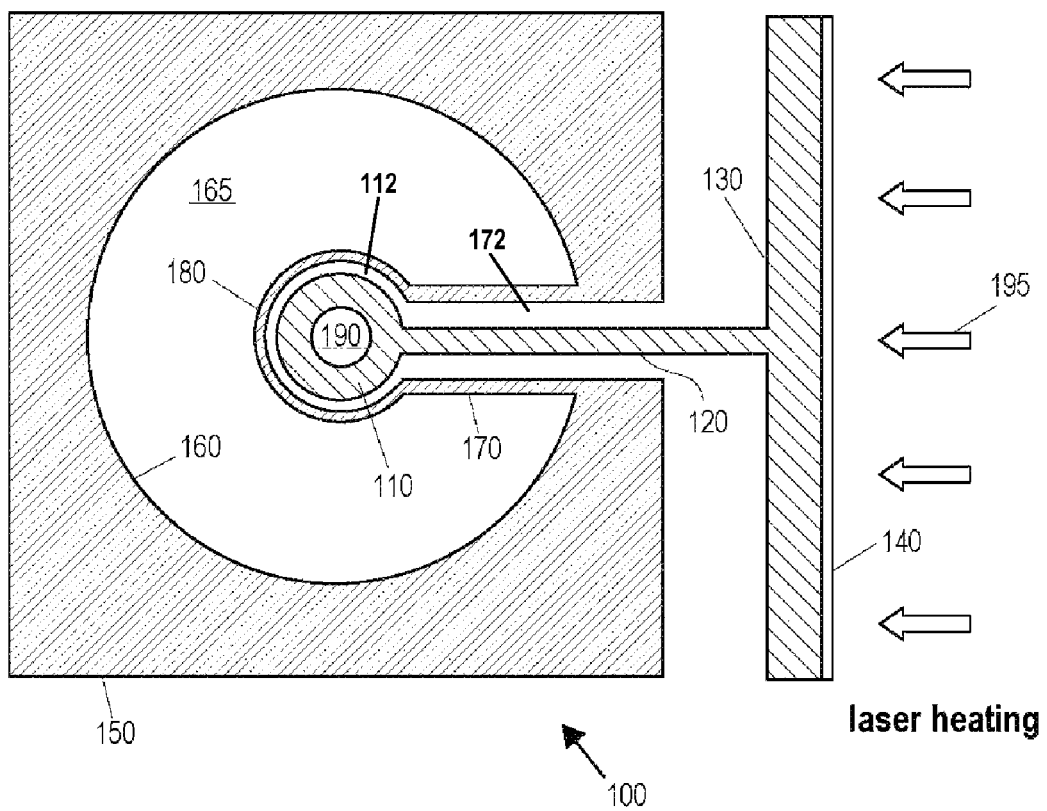

FIG. 2 is a top view of the device of FIG. 1A, depicting the thermal flow path from an external energy source.

FIG. 3A-D is a depiction of the photolithographic (or alternatively using LIGA) method building a phase-element of this invention.

FIG. 4 is a schematic of the relative locations of the contrast enhancement element within a typical electron microscope.

FIGS. 5A-5D are unscaled schematic drawings of cross sections of a silicon wafer as it should appear at key stages of an improved microfabrication process.

Figure 6A:
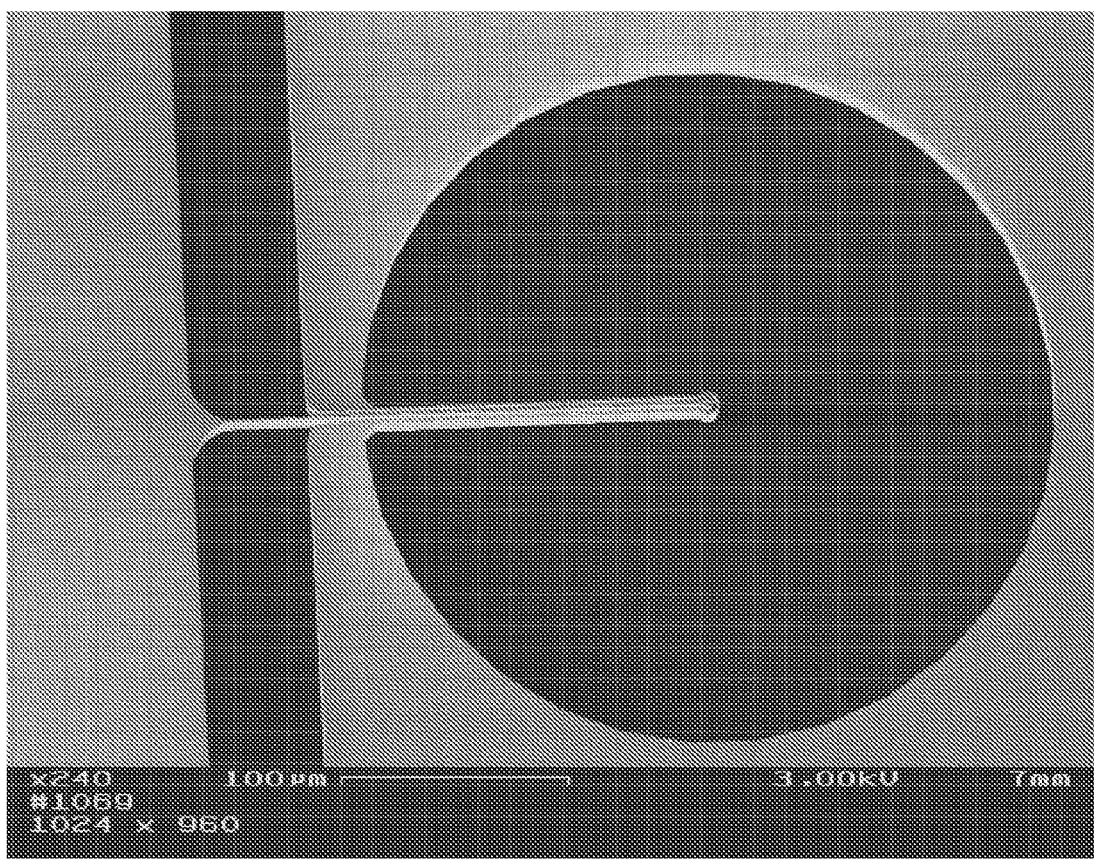
Figure 6B:
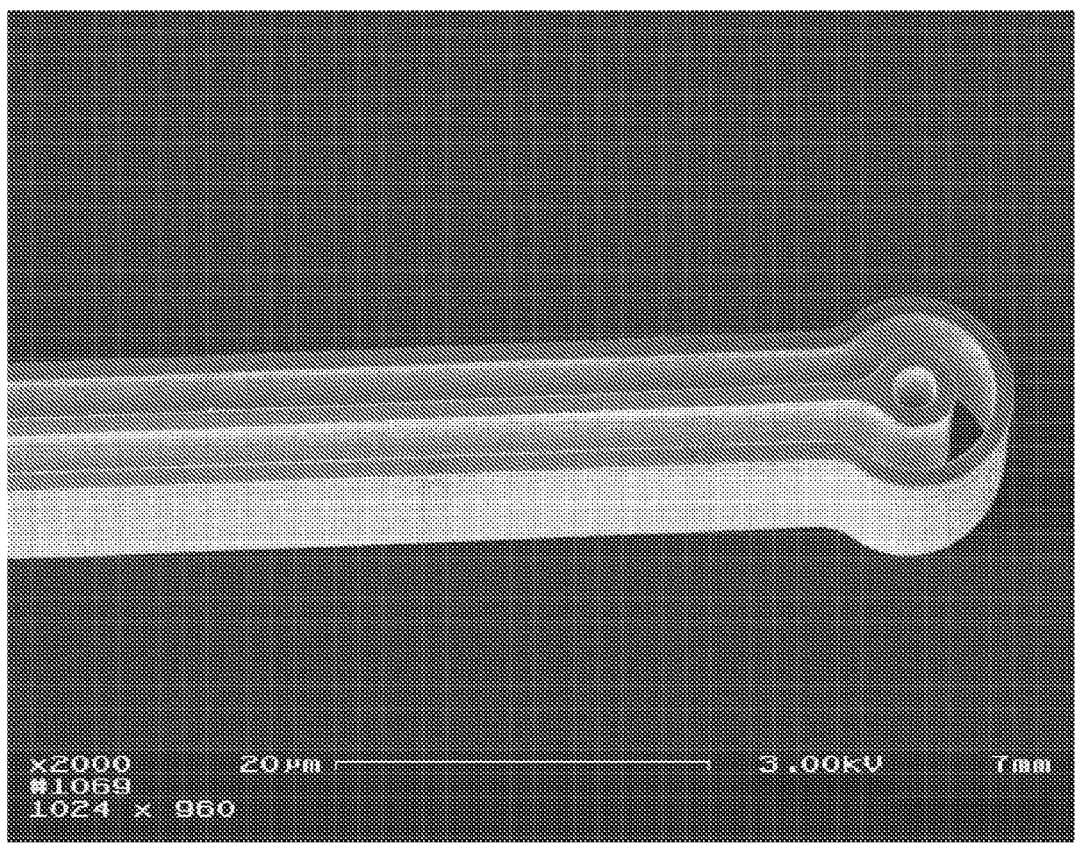

FIGS. 6A and 6B are scanning electron microscope images (recorded at 3 kV accelerating voltage) of one of the phase contrast devices produced during the development of the process flow that is described in the text. FIG. 6A shows a low-magnification image showing the entire circular hole of the objective aperture, which has a diameter of 300 µm. The beam comprising the biased electrode enters from the solid piece on the left, which is insulated from the grounded, circular aperture. The guard electrode surrounding the biased electrode emerges from the inner edge of the aperture, as is also shown in FIG. 1. FIG. 6B shows a higher magnification view of the center (tip) of the phase contrast device. The long beam of the biased electrode terminates in a hollow cylinder, and this is surrounded by the nearly cylindrical guard electrode.

Figure 7A:
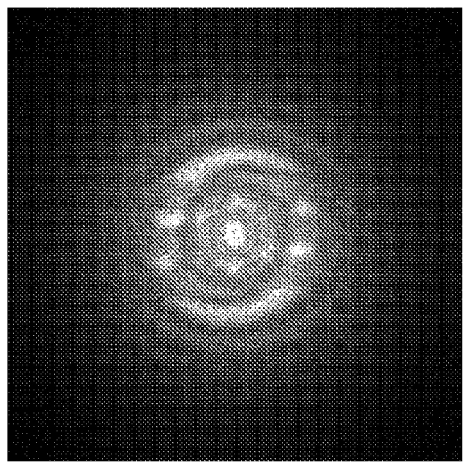
Figure 7B:
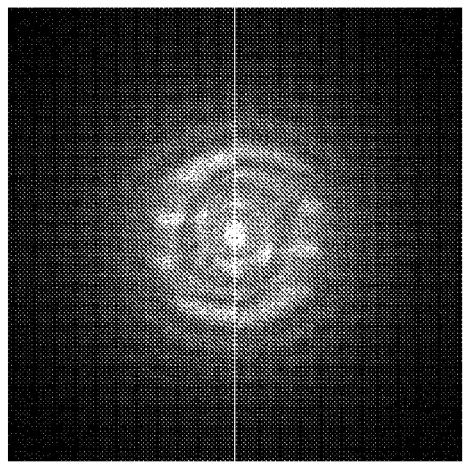
Figure 7C:
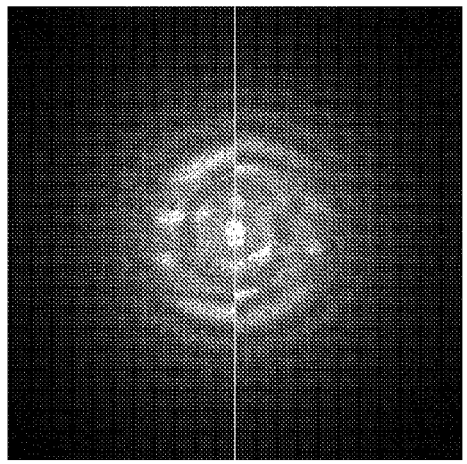
Figure 7D:
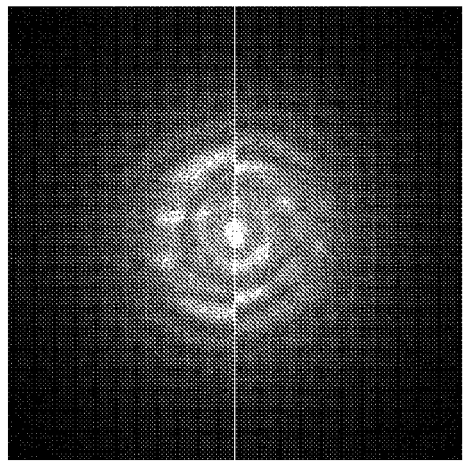

FIGS. 7A-7D demonstrate an increase in the relative phase of the scattered and unscattered electrons as the voltage on the biased electrode is increased. FIG. 7A shows a power spectrum (Thon pattern) of an image recorded with no bias voltage on the phase-contrast aperture. The departure from circular symmetry is due in the first instance to the supporting structure of the electrodes, but in addition it is believed that a minor contribution is made by imperfect centering of the unscattered beam within the hole of the biased electrode. FIG. 7B is a split-screen comparison of Thon patterns obtained with and without a bias voltage of 3.6 mV. FIG. 7C demonstrates the increased shift in the radial position of Thon rings when the bias voltage is increased to 7.2 mV. FIG. 7D shows the final shift in positions of Thon rings indicates that a nearly perfect 90 degree phase shift is produced by a bias voltage of 10.8 mV.

Figure 8A:
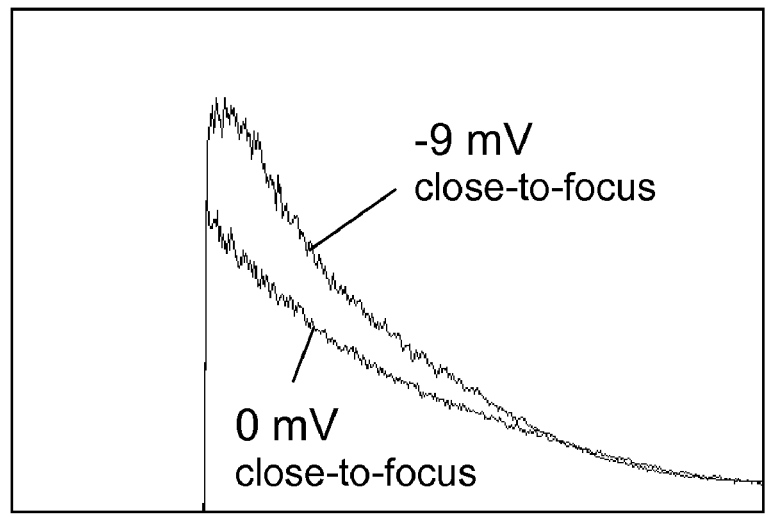
Figure 8B:
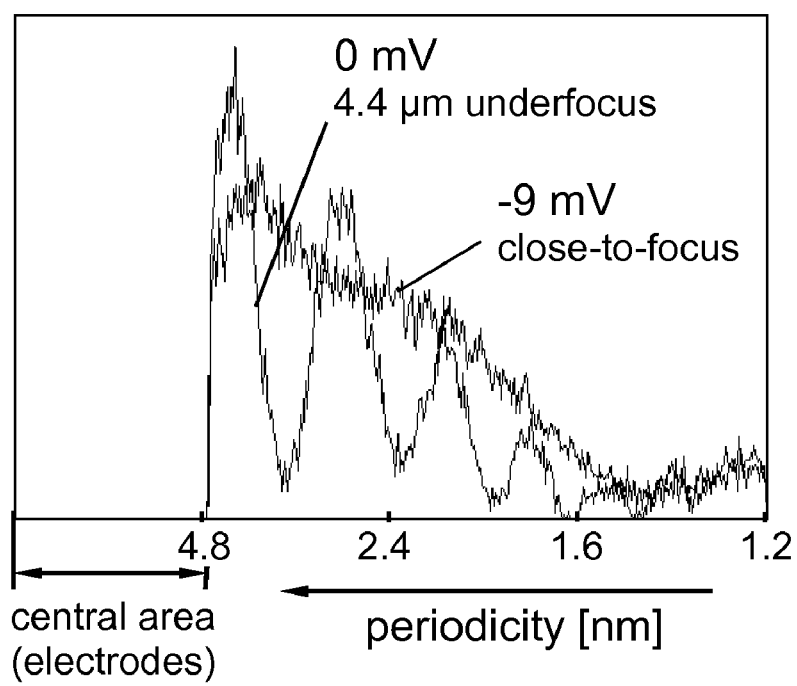

FIGS. 8A-8B show a nearly uniform, in-focus phase contrast transfer function (CTF) achieved with the drift-tube type phase-contrast aperture. Curves shown here are radial representations (integrated over an angle of 60 degrees in the 2-D power spectra) of the power spectra of images recorded for amorphous germanium evaporated onto a thin, amorphous carbon substrate. Values of the power spectra below a spatial frequency corresponding to the low-frequency cutoff imposed by the electrodes would not be used in data analysis, and thus are not shown in this figure. In FIG. 8A, the lower curve is the power spectrum of an in-focus image recorded with zero bias. This curve is interpreted as being the power spectrum of the electron shot-noise in the image intensity, and thus it provides an operational estimate of the modulation transfer function (MTF) of the CCD camera used to record the image. The upper curve is the power spectrum of an in-focus image recorded with a bias of 9 mV on the inner electrode of the phase-contrast aperture. The fall off of this curve is due in part to the MTF of the CCD camera, but in addition it is likely that charging of the phase-contrast electrodes also contributes an additional envelope function that leads to a greater fall off than can be accounted for by the camera MTF. In FIG. 8B, the upper curve shown in panel A is shown here after subtracting the shot-noise background and correcting for the estimated MTF of the CCD camera. Superimposed on this curve is the radial power spectrum of an image recorded with zero bias but a large objective lens defocus, following the same compensation for shot noise and the camera MTF. It is apparent from this comparison that the in-focus CTF at low resolution is about 0.8 rather than 1.0, which is partly due to the fact that the unwanted fringing field has a relatively large effect when the device thickness is only 5 mm, and partly due to the fact that the voltage of 9 mV applied during this experiment was slightly less than what is needed in order to produce a phase shift of 90 degrees.

DETAILED DESCRIPTION OF THE PREFERRED EMBODIMENT

Definitions

LIGA, an acronym for the German words "Lithographie, galvanoformung und abformung" for lithography, electroforming, and molding is a micromachining technology that uses high energy x-rays from a synchrotron to create high aspect-ratio microdevices having micron to millimeter features. At the Lawrence Berkeley National Laboratory Advanced Light Source (ALS), the LIGA process begins with deep etch x-ray lithography (DXRL) of thick, low stress, photoresists, typically polymethylmethacrylate (PMMA). This is accomplished with the use of a mask patterned with high Z (atomic number) absorbers that prevent penetration of x-rays. The x-ray mask substrate is preferably made of a material that minimizes the loss of x-rays through absorption, which suggests low Z materials such as silicon and beryllium. The mask absorber material is, conversely, a high Z material corresponding to a high x-ray absorption coefficient material, such as gold or tungsten. In the open areas of the patterned mask radiation passes through the mask substrate and exposes the PMMA resist, which is then chemically developed. The exposed cavities replicate the mask and are used as molds for electroplating. The electroplating step can be the final step in the process or the electroplated part can be used as a mold for replication from another material such as a plastic or ceramic.

Electron Microscope is a device for forming greatly magnified images of objects by means of electrons, usually focused by electron lenses.

Back Focal Length means the distance from the principal plane of a lens to its focal plane.

Introduction

This invention addresses three technical problems typically extant in electron microscopy: 1) fabrication of a desired electron-optical element on a micrometer scale of size, in order to be commensurate with the scale of the electron diffraction pattern in the back focal plane of the objective lens of an electron microscope; 2) prevention of electron optical element from contamination with non-conducting material when it is hit by electrons in the back focal plane; and 3) keeping the central hole of the electron optical element centered on the focused, unscattered electron beam.

The invention may allow electron microscopists to obtain higher-contrast images of weak phase objects simultaneously with the objective lens properly focused on the specimen (the so-called "in focus" condition). The electron optical phase enhancement element will likely provide uniform contrast for all ranges of resolution, at a level that theoretically approaches the maximum that physics can allow. The electron optical element will also make it possible to use nearly all of the scattered electrons to form the image.

Rationale for the Two-Electrode Design

In an ideal phase-contrast device of the type proposed by Boersch, a phase shift of π/2 would be applied to the unscattered beam while the scattered electrons would experience no phase shift at all. In order to approximate this ideal in a real device, the stray field from the biased electrode(s) must be kept to a minimum in the space where the scattered electrons pass.

In the "on-paper" design proposed by Boersch, the biased electrode of the einzel lens was fully enclosed by a grounded electrode. Such a device, while easily built on the macroscopic scale, is complicated to realize through microfabrication. Separately fabricated electrodes and supporting insulators would be difficult to align on the micrometer scale, of course. On the other hand, it is a concern that the use of continuous insulating layers to separate electrodes (in a device that is fabricated as a single piece) might pose problems if exposed areas of the insulator become charged by stray electrons. In addition there could be complications resulting from radiation damage to the insulator when the device is hit by an intense electron beam.

An alternative approach is to use a physically separate guard electrode to shield the region in which the elastically scattered electrons must pass and use a vacuum gap to insulate the two electrodes. This is, in fact, the approach adopted in this design, which is shown schematically in FIG. 1A in 3D perspective. The adoption of two concentric (i.e. "inner" and "outer") electrodes rather than three, sequentially stacked electrodes (the design that is commonly used for an einzel lens) frees one from the more complicated fabrication requirements of the traditional three-electrode design, especially when one considers the need to shield the region where the scattered electrons will go past the phase-shifting device. As is illustrated in the conceptual design shown in FIG. 1A, the biased electrode and the surrounding (grounded) electrode must each be supported by narrow extensions to the outer part of the aperture.

It should be pointed out that in either design the usual function of an einzel lens, i.e. to focus the electron beam, should be so weak that it can be ignored. Instead, in this application its function is to alter the de Broglie wavelength of the unscattered electrons so that an integrated phase shift of 90 degrees is applied to the unscattered electrons relative to the scattered electrons. The shielded drift tube that is used for this purpose in the device can be considered as a special case of an einzel lens.

Intuitively, the two-electrode design should be fabricated with a relatively large aspect ratio (meaning the ratio of the height to the width of a trench) in order to contain the majority of the applied electric field within the device. The magnitude of the fringing field and its dependence on the aspect ratio are addressed quantitatively in the following section of this paper. To summarize, however, the largest phase shift experienced by the scattered electrons can be almost 30 percent of that experienced by the unscattered electrons if the aspect ratio is 5:1, but this phase shift becomes progressively smaller as the aspect ratio increases. Even when the aspect ratio is as small as 5:1, the value of the in-focus contrast transfer function (for a weak phase object) should still be 0.89 or more at all spatial frequencies, and thus even in this worst case the effect of the fringing field has relatively little impact. Presently calculations are underway determining the CTF for aspect ratios of less than 5:1, for instance about 3:1 and about 2:1.

Electron-Optical Constraints on Scale and Aspect

The outer radius of a Boersch-type phase contrast element determines the value of the lowest spatial frequency (the reciprocal of the largest spatial periodicity), $S_{low-pass}$, that contributes to formation of an image. To be more complete, the low-frequency cut-off depends upon the focal length of the objective lens and on the electron wave length, as well as on the outer radius of the phase-contrast element. The complete expression for the lower cut-off frequency is $$S_{low-pass} = \frac{R_{outer}}{\lambda f} \qquad \text{Equation 1}$$

where $R_{outer}$ is the outer radius of the grounded electrode, λ is the electron wavelength, and f is the focal length of the objective lens.

In a "prototype" design described below, it has been possible to fabricate devices with an outer diameter of 8 μm, i.e. $R_{outer}$=4 μm. Since the prototype design is for a 100 keV microscope, λ is 0.0037 nm. The objective lens is therefore operated with a focal length of approximately 5 mm in order keep $S_{low-pass}$ as low as 1/(4.6 nm). A focal length of ~5 mm is about 2 times larger than is customary for state-of-the-art (high-resolution) electron microscopes, but not an unreasonably large value to start with for experiments designed to evaluate the proof-of-concept.

The diameter of the inner hole of any Boersch-type phase contrast element must not be too small, if one requires that all of the unscattered electrons should be transmitted through the device. The smallest (focused) waist of the unscattered-electron beam has a diameter equal to the product of the focal length of the objective lens and the full angular range of incident electrons. While it is true that the degree of collimation of the incident beam is an experimentally adjustable parameter, proportionally smaller values of the range of illumination angles can be realized only at the expense of a quadratic reduction of the beam intensity.

In this prototype design, it is assumed that the device will be used with the illumination adjusted to have a beam that is parallel to within $2\times10^{-4}$ radian, which provides a reasonable compromise between having adequate beam intensity and having a high degree of spatial coherence. Good spatial coherence is desired in order to ensure a high value of the envelope function at high resolution. The diameter of the focused, unscattered-electron beam would thus be ~1 μm. In order to allow a margin of safety, the diameter of the inner hole in one prototype is 2 μm. The size of the inner hole, together with practical limitations on the width of the individual features of the device, determines the outer radius of the device, and thus the low-frequency cut off. It is not unreasonable, however, to think that a final device could be made with an outer radius of 2 μm, which would reduce the low-frequency cut off to 1/9.2 nm, while keeping the radius of the inner hole at 1 μm. Further reduction of the lowest spatial frequency transmitted by the phase-contrast device would require increasing the size of the electron diffraction pattern at the plane of the device.

The main consideration that determines the aspect ratio of the device is that the phase shift applied to the scattered electrons (due to the fringing field) should be a small fraction of that applied to the unscattered electrons. The phase shift is determined by the path integral of the electrostatic potential:

$$\delta\Phi = 2\pi \frac{1+eU/m_0c^2}{2\lambda U(1+eU/2m_0c^2)} \int V(r)ds, \quad \text{Equation 2}$$

where

δΦ=the phase shift;
λ=the electron wavelength;
e=the electron charge;
$m_0$=the rest mass of the electron;
c=the speed of light;
U=the accelerating voltage of the microscope;
V(r)=the three-dimensional electrostatic potential at a vector position, r, due to the phase-contrast device;

and the integral is over the path, s, followed by electrons as they go through the device.

The phase shift for electrons passing through the central hole of the inner (biased) electrode is easily estimated by approximating V(r) in Equation 2 as a rectangular potential distribution of length equal to the length of the electrode. According to this simplified approximation, the voltage applied to the biased electrode should be about 17 mV for a device that is 10 μm thick. In the real case, however, the voltage applied to the biased electrode will extend out into space for a considerable distance from the electrode. Although the value of the voltage outside the device will decay rapidly with distance, the extended path-integral will still make a significant contribution to the phase shift. As a result, the value estimated by approximating the voltage as a rectangle function is just an upper bound on the true value that should be applied in order to produce a 90 degree phase shift.

Electrostatic calculations were performed in order to quantitatively estimate the three-dimensional voltage distribution, V(r), for a variety of representative feature-sizes. The relative magnitude of the fringing field that extends out beyond the guard electrode is needed in order to estimate the phase shift that would be applied to the scattered electrons. The ANSYS Multiphysics software package (http://www.ansys.com/) was used to carry out numerical analyses for a wide range of geometries. This package uses a finite element procedure to solve problems that are without any analytical closed-form solution due to the complexity of the geometry. The electrical potential is defined by interpolation functions (shape functions) that are associated with each element, and thus the potential is characterized by the values of the dependent variable in specified points called nodes.

The electrostatic analysis in this work was simplified by assuming axial symmetry about the central hole of the inner (biased) electrode of the device and by considering a two dimensional, longitudinal cross section of this axially symmetric, 3-D model. This simplification does not provide a description of the fringing field adjacent to the supporting structures, but this should be similar to that adjacent to the quasi-cylindrical electrodes. In addition, the simplification does not provide a description of the effect that the supporting structures will have on breaking the cylindrical symmetry near to the central electrodes, but this is certain to be small. All regions of vacuum were modeled by a relative permittivity (constant) of 1.0. The mesh required for the finite element analysis was created using PLANE121 elements, which are 8-node, charge-based electric elements. This type of element has one degree of freedom (the voltage) at each node. To achieve greater accuracy at critical points in the calculated electrical potential distribution, a finer mesh was created in the area of interest close to the inner electrode and around the corners of both electrodes.

FIG. 1B depicts the detailed nomenclature associated with the invention. A representative example of the results obtained by these electrostatic calculations is shown in FIG. 1C for a device that is 10 μm thick. The left-hand edge of FIG. 1C corresponds to the central axis of the electrodes. The cylindrical wall of the inner (biased) electrode is represented by the first white bar, while the second white bar represents the cylindrical wall of the outer (grounded) electrode, or guard ring. Referring to FIG. 1B, the parameters assumed for this particular calculation were $r_{in}$=0.75 μm, $w_1$=1.5 μm, $g_1$=1.5 μm, $w_2$=1.5 μm, and $r_{out}$=150 μm. All values of the three-dimensional potential scale, of course, with the voltage applied to the central electrode. Values of the electrostatic potential are represented in contours with a step size of 0.1 times the applied voltage, V, except for the addition of the outer contour at a voltage of 0.05 V. The voltage within the cylindrical hole of the biased electrode is nearly constant, as should be expected, but even so the approximation of this part of the potential by a uniform, rectangular step (as used above) is not absolutely correct.

FIG. 1C shows that relatively low values of the electrostatic potential extend beyond the edge of the guard electrode, out into the open area of the aperture. As a result of this fringing field, the electrons scattered at angles just beyond the edge of the guard electrode will experience an unwanted phase shift. Quantitative evaluation of the path integral through the fringing field shows that the amount of unwanted phase shift is greatest for rays that pass very close to the edge of the guard electrode, and that the unwanted phase shift falls by roughly a factor of 10 at the outer edge of the aperture. The maximum amount of unwanted phase shift due to the fringing field depends on the device thickness, of course. For a device thickness of 5 μm it is less than 0.3 times the phase shift applied to the unscattered electrons, for a device thickness 10 μm this factor is less than 0.2 and for a device thickness of 20 μm it is less than 0.12. Thus if the CTF is set to be 1.0 at high spatial frequencies (i.e. corresponding to a phase shift of 90 degrees), it will be less than 1.0 at low spatial frequencies, and if it is set to be equal to 1.0 at low spatial frequencies, then it will be less than 1.0 at high spatial frequencies. Deviations from a perfectly flat CTF value of 1.0 will nevertheless be relatively small, even for the "worst case" of a device thickness equal to 5 μm, in which case one might expect the lowest value of the CTF to be sin $\{(90-0.3\times 90) \text{ degrees}\}=0.89$.

Finally, although the results are not shown here, calculation of the strength of the electric field shows that it will be far below what would cause dielectric breakdown at even the sharpest edges of the device, when the voltage on the biased electrode is sufficient to produce a 90 degree phase shift for the unscattered electrons.

Device Description

A microfabricated electrostatic device selectively applies a 90 degree phase shift to the central (unscattered) beam in the back focal plane of the objective lens of an electron microscope. This phase-shift device provides a near-ideal phase contrast for biological specimens, which are typically weakly scattering phase objects. Although the general concept of applying a selective 90 degree phase shift to the unscattered beam was first proposed by Hans Boersch as early as 1947, its realization would have been unthinkable at that time without the development of micrometer- and submicron-scale three-dimensional fabrication techniques. An optimal phase-shift device would: prevent electrostatic charging of the phase-element device, be kept centered on the unscattered electron beam, and would be axially aligned with the un- or slightly-scattered electron beam.

This device and method is based on the novel design concept of using an axially symmetric, 2-electrode electrostatic element that can be readily microfabricated on a size scale below 10 um by standard methods or by LIGA technology. The 2-electrode element, shown in FIG. 1, can be aptly described as being similar to a shielded drift tube, down the center of which the electrons travel for a distance of micrometers at a constant electrostatic potential. This distance may be from 1-200 micrometers, or longer. In one embodiment, a preferred distance is about 10-30 micrometers.

The shielded drift-tube design is uniquely different from the classic, 3-electrode "Einzel lens" originally proposed by Boersch. An Einzel lens consists of three parallel, planar electrodes with small, aligned holes through which the unscattered electron beam would pass. It appears that no practical scheme for microfabricating such an Einzel lens has yet been proposed.

Referring now to FIG. 1, an electrostatic element 100 comprises a central tube 110, supported by a conducting plate 120 that extends out of the area of the objective aperture of the electron microscope. The conducting plate 120 attaches to a larger bias support 130, which may or may not have a thermally absorptive surface 140 which may be heated by various means, such as infrared laser, visible laser, or other non-coherent high intensity light source. This central tube 110 will be held at a small voltage difference above or below ground potential by suitably biasing the bias support 130; such voltage difference may be variable. A combined guard ring and outer aperture 150 has a bulk opening perimeter 160 (in one embodiment, about a 150 micron diameter) that is a partially open space. In the partially open space 165, is a ground projection 170 that extends to surround the central tube 110 and its conducting plate 120. The ground projection 170 is spaced apart from the conducting plate 120 by a vacuum gap 172, and extends to form a grounded tube 180, which serves as a guard-ring electrode shielding the electric field produced by the central tube 110 when voltage is applied to it. The guard ring, or grounded tube 180 is spaced apart from the central tube 110 by a radial vacuum gap 112, and prevents scattered electrons from being phase shifted by the voltage that is applied to the central tube 110. In one embodiment, the grounded tube 180 may be 5 microns diameter or less.

When placed in the back focal plane of the objective lens of an electron microscope, the phase shifting element 100 will be positioned such that the focused, unscattered electron beam will pass through the hole 190 in the central tube, while all electrons that had been scattered beyond a given, small angle will pass outside the grounded guard ring tube 180. As a result, only the unscattered electrons will experience a phase shift due to the electrostatic potential on the central tube 110 as they travel through the distance of the drift tube. The amount of phase shift experienced by the unscattered electrons, relative to the scattered electrons, can then be controlled by controlling the voltage that is applied to the central tube via the bias support 130. This distance may be from 1-200 micrometers, or longer. In one embodiment, a preferred distance is about 10-30 micrometers. This distance could most easily be achieved by maintaining the thicknesses of the guard ring 150, the conducting plate 120, and the larger bias support at the same thickness as depicted in FIG. 1. Alternatively, the thicknesses may be altered to achieve the additional requirements for mounting positioning of the electrostatic element 100 as further depicted in FIGS. 3A-3D below.

The conductive plate 120 that supports the central tube 110 is in thermal contact with the bias support 130 and thereby in thermal contact with the optional thermally absorptive surface 140. The thermally absorptive surface 140 can in turn be heated when illuminated with a suitably intense light source, or laser beam 195, as is illustrated in FIG. 2. Radiative heat transfer from the central tube 110 may also be used to heat the surrounding grounded tube 180, which is spaced apart from the central tube 110 by a radial vacuum gap 112. Contamination of the central tube 110 of this device, when it is hit by either the unscattered electron beam (during initial alignment) or by electrons scattered at small angles, will be prevented by maintaining the central tube 110 element at a temperature above ~200° C. It is also completely possible to heat up the outer ring grounded tube 180, if desired, by the same technique, as well as the entire device 100 structure.

Because of the extremely small size (100 microns is on the order of size of the cross section of a human hair) of the hottest elements of this device 100, the thermal load that this element will place on biological specimens under examination should be either quite negligible or easily managed.

This invention is particularly applicable for research on biological specimens that are described as weak phase objects. Phase contrast enhancement may prove useful to improve the contrast and image quality of electron microscope images in a way that allows quantitative interpretation of the images in terms of the structure of the specimen. Such research may include, but is not limited to, specimens of isolated biological macromolecules, thin crystals or other ordered arrays of biological macromolecules, thin sections of cells and tissues, and suitably thin whole-mounted cells.

This device and method will likely be of similar benefit to electron microscopy of all other types of weak phase objects, regardless of the field of application. It should also be used in a more empirical way with strongly scattering specimens, even under conditions in which the phase contrast images that are produced may not be so readily interpreted in terms of the structure of the specimen.

The design of this phase-element will also provide a measurement of the fraction of the scattered electrons that hit the central tube. The amount of this current will likely change when the unscattered beam is not well centered in the hole of the central tube relative to when it is properly centered on the axis of the tube. Such a difference may be used as an error signal input to a device that maintains optimal centering of the unscattered beam.

Initial Device Fabrication

Due to its small size and stringent functional requirements, this phase plate will most likely be fabricated by employing several combined microfabrication techniques. To build features combining high aspect ratio and high accuracy as required in this application, it is possible that LIGA would be used as the primary technology. Based on prior experience working with LIGA, it is expected that there would be no major difficulties in building the basic structure on a solid substrate support, such as a sheet of metal, silicon or plastic. To allow the scattered electron beams to pass through this plate, however, a hole with size equal or larger than the diameter of the outer ring (for example 50-300 um) must be made on the substrate support. The design of the substrate support is the most challenging because, on one side where the phase plate is to be built, the support must be a good insulator however, on the opposite side facing the incident beam it must be a good conductor. Moreover, the inner wall of this hole should be coated with a conductive layer to eliminate the risk of charge building-up.

FIG. 1 is a three-dimensional sketch of the phase-shifting, electron-optical element. Components are not drawn strictly to scale. All features are microfabricated in-place and thus are produced in an already aligned configuration (no assembly is required). The inner cylinder and its connections to the heating blocks on the right are electrically insulated from the outer cylinder, thus allowing the inner cylinder to be biased at a small voltage relative to ground potential.

FIG. 2 is a drawing of the phase shifting element, with components not drawn strictly to scale. The emphasis in this drawing is to explain the method of heating, by use of a laser beam.

FIG. 3A-D illustrates a photolithographic (or alternatively using LIGA) method 300 for building the phase-element 100.

Initially refer to FIG. 3A. First, beginning on a sheet 310 of poly(methylmethacrylate) (PMMA) previously coated with 70 Å Cr 320 (typically from 10-10,000 Å, but preferably 70 Å Cr) and a 500 Å thick layer of Au 330 (typically from 10-10,000 Å, but preferably 500 Å Au), this substrate 310 is coated again by a thick layer (~30 um) of PMMA 340 and covered by a X-ray photomask 350 that corresponds to the structure of the phase-element.

The type of X-ray mask used here is deposited first, photolithographically exposed to the pattern 355 of the resulting structure, and then etched, thereby removing the photoresist mask over the locations where the structure is to be built. After X-ray exposure of the PMMA beneath openings in the photomask, the bonds of the PMMA become susceptible to etching, and such PMMA is etched away to the Au 330 etch stop layer. Thereafter, an electroplated metal, such as Ni, is plated on the exposed Au 330, thereby forming a portion of the guard ring base 150, the ground tube 180, and the central tube 110. After the electroplating (or electroless plating) step, the residual photomask 350 is removed, as well as the PMMA 340 down to the Au 330 etch stop. Thereafter, the unplated regions of the Au 330 and CR 320 layers are also removed by etching.

Referring now to FIG. 3B, on the PMMA sheet side 310 the same or analogous photoresist (now referring to photomask 2 or 353 of FIG. 3A) method is used to build up the metal shield sleeve 150 within the PMMA sheet 310 (the sleeve 150 portion is denoted 360). The sleeve 150 is built up to approximately the surface of the PMMA sheet 310. Thereafter, both the metal shield sleeve 150 and back side of the PMMA sheet 310 have deposited another Cr layer 325 and Au layer 335 within the dimensional ranges previously elucidated for these layers. Atop the Au 335 layer is placed a second PMMA layer 345 of a suitable thickness for the final device overall dimensional thickness (here, the preferred device is from 50-100 μm). On the other side of this substrate 310, a third photomask 355 is used for making the metal sleeve 150 support 370 that will shield the electron beam from hitting the inner wall is also imposed.

Referring now to FIG. 3C, after exposing both sides of this substrate to essentially collimated X-rays from a suitable source, it is plated with Ni, resulting in the metal structure 370 of the desired phase-element on one side and a metal sleeve 150 on another side which should be facing the incident electron beam in the application. In order to make a good electrical contact with the metal sleeve and shield the PMMA from the incident beam as well as improve the mechanical strength of the substrate support, a similar procedure is repeated. That is, Cr 325 and Au 335 coatings and a 30 μm thick photo-resist are added to the front side and the third photomask is applied. After exposure, development, and metal plating, a thick metal structure 370 (which functions as an X-ray mask) is built up on the front surface. Over the area where the electron beam is desired to pass through, the plating base of Cr 325 and Au 335 are removed with a chemical etch. Now, the front side is exposed to X-rays and subsequently developed to create a hole on the supporting substrate. To ensure high quality, the element is subjected to another round of chromium etch that will remove the Cr 322 from the phase-element on the back side of the structure.

Although the complete structure disclosed in FIGS. 1 and 2 are not fully shown during fabrication in FIGS. 3A-D, such microfabrication should be readily apparent from the disclosure above.

Referring now to FIG. 3D, the finished device is shown with a small portion of the original PMMA sheet 310 remaining. In reality, such sheet may be much larger, or replaced with a suitable higher temperature capable material to minimize outgassing in high vacuum electron microscope or other applications.

Refer now to FIG. 4, where the implementation of the contrast enhancement device 100 is installed in an electron microscope. Typically, a collimated beam of electrons 410, impinges upon or reflects from a sample to be viewed 420 by the imaging objective 430 (which forms a magnetic or electrostatic equivalent of an optical magnifying lens—see 435 dashed). The distance from the center of the objective 430 to the sample 420 is typically ~3-5 cm in one application, the same as the distance to the back focal plane 440, wherein the contrast enhancement device 100 is emplaced. Note that both the sample 420 and the contrast enhancement device 100 are centered on the optical central axis 450. To the contrast enhancement device 100 are connected voltages at ground 460, and a variable voltage 470. After insertion of the contrast enhancement device 100, the device is operated as previously described, with the modified or nonmodified (corresponding to contrast enhanced or not enhanced, respectively) electron flow continues through the remainder of the optical and/or detector system remaining in the electron microscope 480.

Improved Device Microfabrication Protocol

The improved Phase Plate Device microfabrication for lower aspect ratios requires three photolithographic masks. Two masks (Front-Electrodes and Front-Traces) are used to define the structural and electrical elements of the device on the device layer of a Silicon-on-Insulator (SOI) wafer. The Front-Electrodes mask contains the design of the central electrodes of the phase plate, including the guard ring. The Front-Traces mask defines the electrical elements necessary to connect the device to the electrical feed-through of the objective aperture holder. The third, Backside mask provides a large window on the backside of the SOI to release the top structure and allow the electron beam to pass through the modified objective aperture.

Referring now to FIGS. 5A-5D, one finds unscaled schematic drawings of cross sections of a silicon wafer as it should appear at key stages of the improved microfabrication process. The schematic drawing shows only a single device on the wafer, but in reality many such devices are fabricated on a single wafer. The vertical "center line" indicates the central axis of the cylindrical, biased electrode (see FIG. 1 and FIGS. 6A and 6B for additional views.) Numbered features correspond to ▣the doped-silicon device layer; ▣the buried silicon dioxide layer of the SOI wafer; ▣the 485 μm-thick silicon "handle" wafer; ▣the 0.5 μm oxide layer; ▣the OCG 825 G-line photoresist layer; ▣the SPR 220 photoresist layer.

Figure 5A:
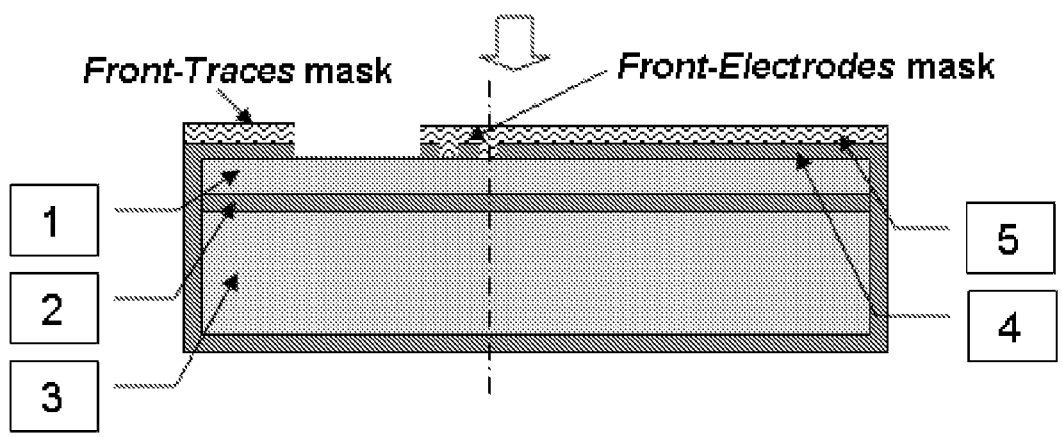

FIG. 5A is a cartoon showing the entire wafer surrounded by a 0.5 μm oxide layer, which was first etched in a pattern determined by the front-electrodes mask. The front of the wafer was then coated with a 1.2 μm-thick layer of OCG 825 G-line photoresist, which in this panel has been used to define the pattern for the front-traces mask. The 0.5 μm oxide layer was patterned in both cases by an "oxide reactive ion etch" (RIE) process.

Figure 5B:
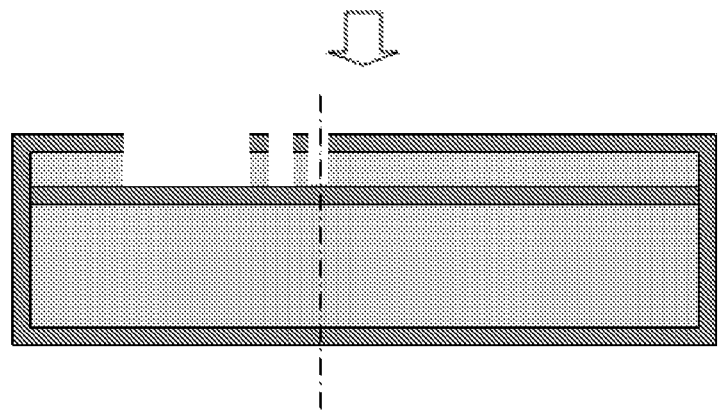

FIG. 5B shows unwanted material in the device layer is then removed by a Bosch Process, for which the buried oxide layer acts as a stopping layer.

Figure 5C:
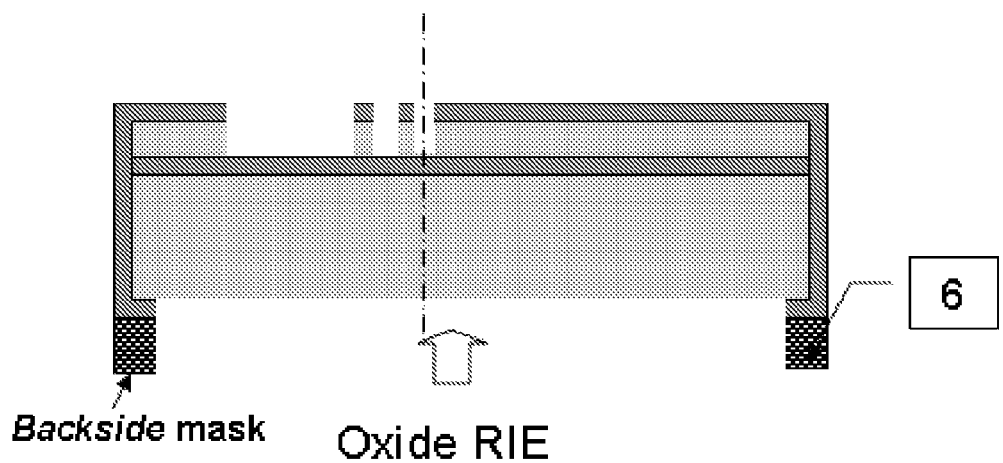

FIG. 5C is after a 10 μm thick layer of photoresist (SPR-220) had been applied to the back side of the wafer and then exposed, selective areas of the 0.5 μm oxide layer are again removed by the oxide RIE process.

Figure 5D:
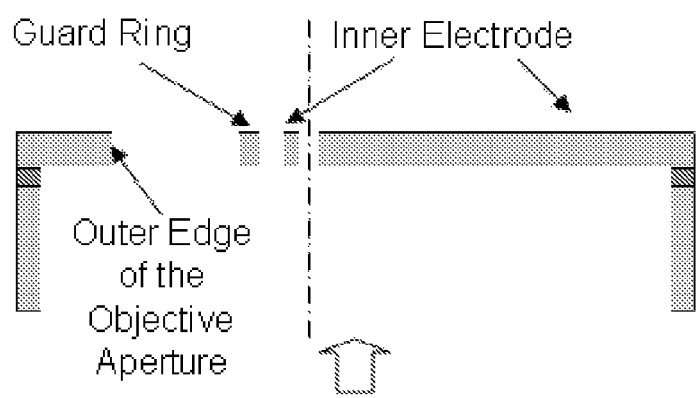

FIG. 5D shows unwanted material in the wafer itself is then removed by the DRIE (Deep Reactive Ion Etch) process, after which all oxide, including that in the buried layer, is removed by a vapor HR release.

The wafers used to develop the microfabrication protocol were double side polished, SOI wafers with a device-layer that varied from a thickness of either 5 μm or 10 μm, depending upon the desired aspect ratio to be tested, and a 2 μm thick buried-oxide layer located below the device layer. The silicon comprising the device layer is heavily doped (P/Boron) to decrease the resistivity (<0.0065 Ohm-cm). The handle wafers were 485 μm thick and had a resistivity of 1-10 Ohm-cm. Wafers were purchased from Ultrasil Corporation (Hayward, Calif.). FIGS. 5A-5D show schematic cross-sections to illustrate the progress made at various steps of the process flow. The main fabrication steps are briefly described as follows. Each process step is indicated in FIGS. 5A-5D with a number and a square surrounding it, and points to the layer affected by the process step.

The first step is to clean the wafer and then deposit an oxide layer that serves as a mask during the high aspect ratio etch of the device layer. A pre-furnace clean was performed to remove organic residues and complex heavy metal ions. This cleaning step was done by immersing the substrate in a piranha bath (2 l of $H_2SO_4$+100 ml of $H_2O_2$) heated at 120° C., followed by a de-ionized (DI) water rinse. A spin rinse/dry for approximately 2 min at 2400 rpm followed. A 0.5 μm oxide mask layer was then grown in a wet thermal oxidation process at a temperature of 1050° C. for approximately 1 hour. The thickness of the oxide mask was selected to be sufficient to mask the front side of the wafer during the prolonged, Bosch Process that is needed to ensure that the narrow trenches become fully etched and create an additional barrier (protection) on the backside of the wafer during the Deep Reactive Ion Etch (DRIE).

The second step is to apply a photoresist layer and then expose it to the pattern on the Front-Electrodes mask. Before applying the photoresist (PR) coating, a standard dehydration bake and a hexamethyldisilazane (HMDS) treatment were performed. The HMDS treatment improves photoresist adhesion to the wafer surface, especially for wafers coated with oxide. A 1.2 μm layer of OCG 825 G-line photoresist (PR) was then spun onto the device layer and heat-treated on a hotplate set at 90° C. for 60 seconds. To project the microlithographic images of the 1 μm features of the Front-Electrodes mask onto the 4" SOI wafer, a GCA 6200 Wafer Stepper was used. Exposure of the PR was followed by a post-exposure bake at 120° C. for 30 seconds to improve the profile of the PR sidewalls. After developing the resist with OCG 934 developer, a standard de-scum procedure was performed using an oxygen plasma at 50 W for approximately 1 minute to clean residual PR from any opened areas. The wafer was then ready to be UV-baked. The UV-bake process cross-links the resist molecules thus increasing the selectivity for subsequent dry-etch applications.

In the third step, the Front-Electrodes mask was etched into the oxide layer, which serves as a "hard" mask. The equipment used to accomplish this step was a Lam Plasma Etcher. The process pressure and the RF power were set to 2.8 Torr and 750 W, respectively, for this particular plasma etch process. Intermediate cooling steps were added to improve PR selectivity.

The fourth step is to create the Front-Traces. To do this the PR was first stripped and cleaned from the front side of the wafer and a new, 1.2 μm layer of OCG 825 PR was spin-coated after a standard dehydration bake and HMDS treatment. A soft-bake followed. The photolithographic step to transfer the Front-Traces pattern onto the PR layer was accomplished by using a Suss Microtec MA6 Mask Aligner contact printer. A front-front alignment was performed. Then the PR was developed and UV-baked. After the oxide plasma etch the PR was again stripped in order to prepare the wafer for the front side silicon DRIE.

Having thus created both the Front-Electrodes and Front-Traces patterns in the 0.5 μm oxide mask, the fifth step is to etch these patterns into the device layer. A Surface Technology Systems (STS) Inductively Coupled Plasma (ICP) etch system was used for this step. The plasma is inductively coupled at 13.56 MHz through a matching unit and coil assembly. For SOI wafer etching, a separate 380 kHz generator is available to bias the platen (electrode). The Advanced Silicon Etch (ASE) step, which consists of alternating cycles of etching and protective polymer deposition in order to achieve high aspect ratios in silicon, was performed using a low bias frequency recipe until the insulating oxide layer was reached. The low bias frequency recipe helps to reduce ionic charging at the insulator layer in deep and/or high aspect ratio trenches. Consequently, the potential notching or "footing" of Si structures was obviated. In this case the low frequency bias was necessary because of the long over-etch.

The sixth step is to perform photolithography with the Backside pattern. The wafer was once again cleaned, and after a standard dehydration bake the backside was spin-coated with approximately 10 μm of SPR-220 (thick PR). A soft-bake followed at 90° C. for 8 minutes. A front-back alignment was then performed using the Suss MA6 contact printer. After the exposure and before the post-exposure bake it was important to wait at least 30 minutes so that the photoactive compound in the resist was fully broken down. To improve the PR profile a soft bake at 70° C. for 2 min, followed by another heat treatment at 90° C. for 4 min, was done on hot-plates. Developing the SPR 220 resist was accomplished by immersing the wafer in a solution of LDD 26W developer for 3 min. The thick resist was then baked in order to provide a good mask for the silicon oxide plasma etch, and for the subsequent and relatively long back-side DRIE processing.

At this point, the wafer was prepared for the Backside plasma etches. A handle wafer was used to protect the DRIE equipment's electrostatic chuck from damage when etch breakthrough occurred. The handle wafer was bonded to the front side of the device wafer using a 2 μm thick photoresist layer as a bonding agent. The first etch allowed the Backside mask to be transferred onto the oxide layer. Due to the relatively large thickness of the two wafers bonded together, the gap between the top and bottom electrode of the Lam etcher was increased to 4.3 mm. The Backside etch process consisted of two different DRIE processes. The first etch was timed, and a depth of about 300 μm was reached using a standard high frequency bias recipe. The second etch step was performed using a low frequency bias recipe until the insulating oxide layer was reached (~200 μm deep).

The most critical steps of the Phase Plate Process were then performed: a hydrofluoric acid (HF) vapor release, a wet debonding, a 49% HF clean, a de-ionized (DI) water rinse and a Critical Point Dryer (CPD) dry. Following the CPD step, the devices were stripped of any residual polymers in a 300 W oxygen plasma. An example of one of the phase contrast devices is shown in FIG. 6A in overview, and at higher magnification in FIG. 6B showing the central region with the guard ring.

Proof of Concept

The results that have been able to be obtained in preliminary experiments with a first prototype of the drift-tube phase-contrast aperture demonstrate that it can be used to apply a phase shift of 90 degrees between the scattered and unscattered electron beams. The preliminary results described below were obtained with a device that was 5 μm thick. The diameter of the hole in the central electrode is 2 μm for this particular device, the electrode widths are 1 μm, and the gap between electrodes is 1 μm; the tip-radius of the device in this case is thus 4 μm.

Experiments were carried out with the device installed in a JEOL 100C electron microscope, operated at an electron energy of 100 keV. The top-entry stage of this microscope made it possible to use the "high contrast" specimen holder for these experiments, which meant that the focal length of the objective lens was substantially longer than it would be on a more modern, side-entry microscope.

A modified objective aperture holder was built for the microfabricated phase-contrast aperture. This device provides "coarse" mechanical positioning that allows one to move between 4 aperture locations, after which fine control of the aperture position is provided by a piezoelectric positioner (Nanocube model P-611K002, PI (Physik Instrumente) L.P., Auburn, Mass.). Coarse and fine controls are both provided in three orthogonal directions. The electrical circuit used to apply a voltage to the inner electrode also allowed switching to a mode in which it is possible to measure the current that is generated by secondary electrons when the electrode is hit by the incident electron beam. This feature made it relatively simple to center the phase-contrast aperture. In a further development (not currently available for the work reported here), the current generated by secondary electrons will be used as a feedback signal to drive the piezoelectric positioner, and thus maintain the centering of the aperture during use.

The specimen consisted of amorphous germanium evaporated onto a thin film of evaporated carbon. Images were recorded on a Gatan Megascan 794/20 CCD camera (Pleasanton, Calif.), and Digital Micrograph was used to provide "real-time" evaluation of the power spectra ("Thon patterns") of the images.

FIGS. 7A-7D show four examples of the power spectra of images that were recorded with different voltage values applied to the inner (drift-tube) electrode. The objective lens was intentionally defocused for this series of images in order to produce bright Thon rings (loci where the wave aberration associated with defocus is already equal to odd-integer multiples of $\pi/2$) at spatial frequencies higher than the low-frequency cutoff imposed by the finite size of the electrodes. The power spectra of the images also show maxima and minima at spatial frequencies corresponding to the gap between the inner and outer electrodes of the device. Single-sideband contrast transfer is also seen at spatial frequencies for which only one side of the electron diffraction pattern, but not the corresponding Friedel mates, is blocked by the electron-opaque electrodes. In practice it is intended to limit data recovery to spatial frequencies higher than the low-frequency cutoff imposed by the radius of the grounded electrode.

The shift in the radial position of the bright Thon rings that are shown in FIGS. 7A-D provides unambiguous evidence for the addition of a further phase shift when a bias voltage is applied to the phase-contrast aperture. As the figure demonstrates, the additional phase shift reaches a value close to 90 degrees when the voltage is ~11 mV. This is close to the value of 13.7 mV that is expected from the numerical calculations of the electrostatic potential. As was already mentioned previously, the fringing field for such a thin (5 μm thick) device is larger than would be ideal. Further work is therefore currently under way with devices that are both 10 μm and 20 μm in thickness, for which it is expected—on the basis of electrostatic calculations—the effect of the fringing field to be considerably smaller.

Evidence of a nearly uniform phase shift at all spatial frequencies is provided by the experimental results obtained when the defocus of the objective lens was set to a value close to zero. FIG. 8A compares the radial power spectra (integrated over a wedge of approximately 60 degrees in order to improve the signal-to-noise ratio) when the bias voltage was 0 mV and 9 mV, respectively. The power spectrum obtained with zero bias is approximately that of electron shot noise. Since the spectrum of shot noise must be "white" (constant at all spatial frequencies), the fall-off in this curve provides an estimate of the modulation transfer function (MTF) of the CCD camera. The power spectrum obtained with a bias voltage of 9 mV also falls off in a way similar to that of the MTF of the CCD camera, but starting with a signal well above that of the shot-noise background. FIG. 8B then shows that when the bias voltage is returned to zero mV but the objective lens is defocused so as to produce the usual Thon rings, the resulting contrast oscillates with spatial frequency, and these oscillations are approximately confined to the lower bound of shot noise and the uniform phase contrast produced when the bias voltage is 9 mV.

As might be expected, the results above, demonstrating the proof-of-concept for this type of phase-contrast aperture, were obtained with some considerable experimental difficulty. Perhaps the greatest difficulty is caused by rapid contamination—and consequent charging—of the device when it is hit by the intense, focused central beam. As a result, the amount of time during which a "clean" device can be used is only about 15-30 minutes, and even during this period it is expected that the performance of the aperture is continuously changing. It is thus fortunate that it was possible to repeatedly clean the device by decreasing the excitation of the first condenser lens and increasing the second condenser aperture size during the cleaning operation. In addition to (in this way) greatly increasing the electron current that hits the device, the second condenser lens was adjusted so that the size of the spot hitting the tip of the electrodes was about 20 µm in diameter, i.e. about twice the size of the device. Whether by heating the device sufficiently or by "sputtering" the carbon from the surface (perhaps through knock-on collisions and Auger processes), the aperture is effectively cleaned and work can again resume. The current limitations caused by contamination and charging are expected to be resolved, however, when design changes are implemented that will make it possible to heat the electrodes continuously during operation.

Discussion

Excellent progress has been made in the development of thin carbon-film phase plates for electron microscopy over the past few years by the group of Nagayama. Earlier attempts to develop modified objective apertures in which a thin film of carbon serves as a quarter-wave phase plate, and even as a "contrast transfer function (CTF) phase" (i.e. CTF sign) corrector, were abandoned over 30 years ago, but it is now clear that the technology needed for such devices to be effective is finally at hand. Even so, the use of thin films of carbon (or other materials) as a quarter-wave plate for electrons suffers from the disadvantage that a significant fraction—about 25% or more—of the signal-carrying electrons that are elastically scattered in the specimen are lost when they are either elastically scattered or inelastically scattered while passing through the quarter-wave plate. The use of a microfabricated electrostatic phase-contrast device (Boersch phase-plate), on the other hand, offers promise of being almost as convenient to use as is the carbon-film phase plate, while suffering essentially no loss of the signal-carrying electrons.

It is anticipated that the development of an electrostatic phase-contrast device must still solve two crucial problems, however. The first problem is to specify a design in which there is only a minimal electrostatic potential (fringing field) in the region of the scattered wave front, together with a process flow for fabricating that design. As has been demonstrated here, the use of concentric cylinders as the electrodes of a phase-contrast device results in a design that should produce minimal fringing fields in the path of the scattered electrons, and microfabrication of such a device is readily achieved with feature sizes in the desired range of 1 µm.

Electrostatic phase-contrast devices are anticipated to have one significant disadvantage relative to thin-film phase plates, however. Although both types of device must provide an open hole for the unscattered electrons that is of the same size, i.e. large enough to accommodate the full width of the angular distribution of electrons for the desired incident illumination, all electrostatic devices will block the electrons that are scattered for some interval of spatial frequencies just beyond the hole, whereas the thin film will immediately provide phase contrast at the lowest spatial frequencies outside the hole.

Attention has been appropriately given in the literature to the fact that contamination of a thin-film phase plate must be carefully avoided, and an effective way has been found to accomplish that. It has not yet been decided what approach to use for the electrostatic device shown here, but laser heating is one alternative that is actively under consideration. Impact by the intense distribution of inelastically scattered electrons will contribute to heating of the central electrodes, as well. On the other hand, knock-on collisions will tend to remove carbon but not silicon at voltages below ~150 keV, and thus cooling (rather than heating) of the modified aperture so as to reduce the re-supply of hydrocarbons by surface diffusion might be an effective strategy to avoid contamination. Other materials will have to be used to fabricate the electrostatic phase plate, of course, if it is desired to use it for electron energies above the threshold for knock-on damage in silicon.

Users may often find that electron microscopy is more complicated when a phase-contrast device is in place because there will be less freedom on how to control the beam size and beam intensity. This complication arises, of course, from the fact that new effects will appear when the focused, unscattered beam extends to angles larger than the central hole of the phase contrast device. Greater flexibility in varying the illumination could be achieved by the addition of a third lens in the condenser lens system. Failure to center the phase contrast device perfectly will also cause some of the lowest spatial frequencies to be represented in the image as single-sideband components rather than as Zernike-type phase contrast components.

Future Directions

Since it has been found that the aspect ratio of the device thickness to the center aperture may be made smaller than the originally envisioned 10:1 or 5:1, newer methods of fabrication have become potentially possible. One such method was described above in the *Improved Device Microfabrication Protocol* section. It is now envisioned that aspect ratios below 5:1 and potentially 3:1 or 2:1 may also yield sufficient contrast to be practicable. At this point, it is believed that the entire device structure may be reduced by a factor of 5× to 10× over those dimensions described above, with the exception that the center aperture remains in the 0.2-0.3 micron diameter through the central tube. Such extremely small features would venture into the realm of nanofabrication, where mask features would be written by electron beam lithography, followed by precisely controlled electroplating. Regardless of the size, however, the concept of the drift tube would continue to be used.

CONCLUSIONS

All publications, patents, and patent applications mentioned in this specification are herein incorporated by reference to the same extent as if each individual publication or patent application were each specifically and individually indicated to be incorporated by reference.

The description given here, and best modes of operation of the invention, are not intended to limit the scope of the invention. Many modifications, alternative constructions, and equivalents may be employed without departing from the scope and spirit of the invention.

We claim:

1. An apparatus for electrostatic control of a charged particle beam, comprising:
   a) a means for electrostatically controlling a charged particle beam;
   b) a means for guarding said electrostatic control means, said guard means spaced apart from and shielding said electrostatic control means by a radial vacuum gap; and c) a voltage source electrically disposed between, and in charged connection with, said electrostatic control means and said guard means.

2. The apparatus of claim 1 further comprising:
a) a thermally absorptive surface affixed to said electrostatic control means.

3. The apparatus of claim 2 further comprising:
a) an energy source radiatively coupled to the thermally absorptive surface.

4. The apparatus of claim 1 further comprising:
a) a thermally absorptive surface affixed to said guard means.

5. The apparatus of claim 4 further comprising:
a) an energy source radiatively coupled to the thermally absorptive surface.

6. The apparatus of claim 1 wherein said means for electrostatically controlling comprises:
a) a central tube with an aperture, such that a length of the central tube is equal to or longer than five times a diameter of the aperture.

7. The apparatus of claim 6 wherein the aperture is less than 0.5 microns.

8. The apparatus of claim 6 wherein the aperture is less than or equal to 0.3 microns.

9. The apparatus of claim 6 wherein the aperture is substantially circular to within 10 percent.

10. An apparatus for electrostatic control of a charged particle beam, comprising:
a) an aperture structure electrically charged by a voltage source comprising:
   i) a central tube with an aperture;
   ii) a conductive plate extending from said central tube;
   iii) a bias support extending from said conductive plate; and
b) a guard ring structure disposed about and electrically isolated from said charged aperture structure, said guard ring structure comprising:
   i) a guard ring base;
   ii) a bulk opening perimeter formed in said guard ring base substantially surrounding said aperture, said bulk opening perimeter forming a partially open space;
   iii) two grounded projections extending from said guard ring base spaced apart by a vacuum gap on both sides from said conductive plate into said partially open space;
   iv) a grounded tube connecting both grounded projections, spaced apart by a radial vacuum gap from and radially enveloping said central tube.

11. The apparatus of claim 10 further comprising:
a) an electrically nonconductive base;
   i) said charged aperture structure affixed to said base;
   ii) said guard ring structure affixed to said base.

12. The apparatus of claim 10 wherein said central tube is of a noncircular cross-section.

13. A method of phase shifting a charged particle stream, comprising:
a) electrically biasing said charged aperture structure relative to said guard ring structure of claim 10 using said voltage source; and
b) passing a charged particle stream through said charged aperture.

14. A method of electron microscope phase enhancement, comprising:
a) providing an electron microscope;
b) providing an axial drift tube apparatus for electrostatic control of a charged particle beam;
(c) providing a guard ring structure disposed about and electrically isolated by being spaced apart from said drift tube apparatus by a vacuum gap; and
(d) positioning the drift tube at a back focal plane of said microscope, in axial alignment with an electron optical axis of said microscope.

15. The method of electron microscope phase enhancement of claim 14, wherein the drift tube comprises:
a) a charged aperture structure; and
b) a guard ring radially disposed about the charged aperture structure.

16. The method of electron microscope phase enhancement of claim 15, further comprising:
a) varying a differential charge state between the charged aperture structure and the guard ring radially disposed about the charged aperture structure, thereby modifying the phase of a charged particle beam as it passes through said apparatus.

17. The method of electron microscope phase enhancement of claim 14, further comprising:
a) heating said drift tube.

18. A method of manufacturing an electron microscope phase enhancement element comprising:
a) a means for forming a spatially connected phase enhancement tube, a guard ring tube electrically isolated from said phase enhancement tube by a radial vacuum gap, and a metal sleeve;
b) a means for extending said metal sleeve into a metal shield;
c) a means for forming a thick metal structure support upon said metal shield; and
d) mounting said spatially connected phase enhancement tube, guard ring thick metal structure support upon a base.

19. An article of manufacture of claim 18 comprising an electron microscope phase enhancement element produced by the method of claim 18.

20. A shielded drift tube comprising the electron microscope phase enhancement element produced by the methods of claim 18.

* * * * *